United States Patent [19]

Misawa et al.

[11] Patent Number: 4,783,597

[45] Date of Patent: Nov. 8, 1988

[54] ION IMPLANT APPARATUS

[75] Inventors: Hisanori Misawa, Tokyo; Hidetaro Nishimura, Kawasaki; Takaya Tsujimaru, Yokohama; Shuji Kikuchi, Kumamoto; Nobuyuki Abe, Yokohama; Kouichi Mori, Tokyo, all of Japan

[73] Assignee: Kabushiki Kaisha Toshiba, Kawasaki, Japan

[21] Appl. No.: 924,370

[22] Filed: Oct. 29, 1986

[30] Foreign Application Priority Data

Oct. 29, 1985 [JP] Japan .............................. 60-242243

[51] Int. Cl.⁴ ........................................... H01J 37/317
[52] U.S. Cl. ................................. 250/492.2; 250/251; 250/398
[58] Field of Search ................... 250/492.21, 251, 398, 250/492.3

[56] References Cited

U.S. PATENT DOCUMENTS 2,890,342 6/1959 Columbe ............................ 250/49.5
4,118,630 10/1978 McKenna et al. .............. 250/492.21
4,463,255 7/1984 Robertson et al. ............. 250/492.21

OTHER PUBLICATIONS

C. P. Wu et al, "Electron-Flood Techniques to Neutralize Beam Charging During Ion Implantation", RCA Review, vol. 44, Mar., 1983, pp. 48-63.

Primary Examiner—Bruce C. Anderson
Assistant Examiner—Jack I. Berman
Attorney, Agent, or Firm—Foley & Lardner, Schwartz, Jeffery, Schwaab, Mack, Blumenthal & Evans

[57] ABSTRACT

An ion implant apparatus which forms ions from an ion source into an ion beam to implant the ions into a target to be ion-implanted through an ion beam introduction tube. The ion implant apparatus comprises: radiation means for radiating an electron beam, the radiating means fixed on the ion beam introduction tube; and a target for being radiated by an electron beam, said target reflecting the electron beam to generate a reflectance beam, the electron beam causing a secondary electron beam to be emitted from the electron beam target, the electron beam target being formed so as to prevent the reflectance beam and the secondary electron beam from being directly radiated on the target to be ion-implanted. The apparatus can keep high energy electrons from the surface of a wafer thereby to prevent the wafer from being charged negatively, and can trap the high energy electrons in the measuring system thereby to decrease errors in measuring a number of dopant atoms.

12 Claims, 3 Drawing Sheets

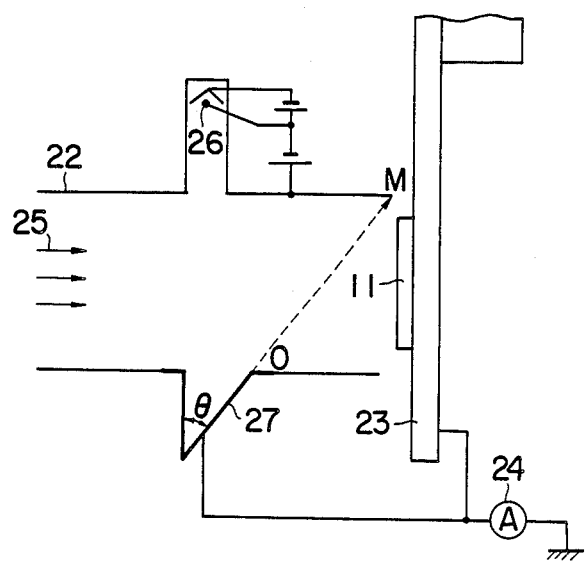
F I G. 3
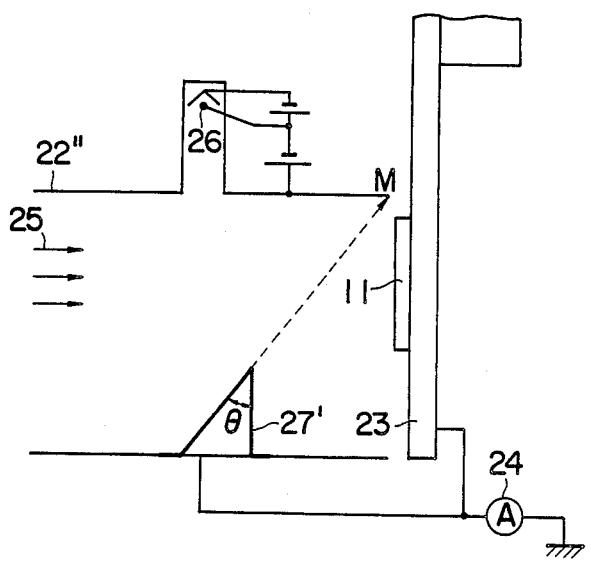
F I G. 4

ION IMPLANT APPARATUS

BACKGROUND OF THE INVENTION

This invention generally relates to an ion implant apparatus which is used in a process of manufacturing a device such as a semiconductor device and, more particularly, to an ion implant apparatus which prevents a semiconductor wafer from being charged, i.e., prevents the insulator of the semiconductor wafer from storing positive charges, when positive ions are implanted in the wafer.

Recently the ion implant apparatus has been widely used to introduce impurity ions into a target such as a semiconductor wafer (hereinafter called "wafer"). Advantageously the ion implant apparatus is capable of controlling the number of the implanted dopant atoms and the depth of the implantation with high precision. Because of this advantage, the ion implant apparatus has become indispensable to the introduction of impurity ions into the wafer.

Generally in the ion implant apparatus, positive ions are accelerated into a wafer for doping. When accelerated positive ions hit the wafer, secondary electrons are emitted out of the wafer, or positive charges are stored in the insulator. Consequently the surface of the wafer becomes inclined to be charged positively, which is a factor for causing electrostatic breakdown to the insulator of a semiconductor device. This results in dropping of productivity.

In view of the disadvantage of the ion implant apparatus, it is essential to prevent the wafer from being charged positively in ion implantation process. The prior art apparatus for avoiding the positive charging of the wafer is the electron flood system shown in FIG. 6.

As shown in FIG. 6, the prior art electron flood system is to prevent the wafer from being charged positively. Positive ions 10 to be implanted are radiated to a wafer 11 on a disk 12 through an ion beam introduction tube 13. While radiating, a current is applied to a filament 14 to generate thermoelectrons (hereinafter called "primary electrons"). The primary electrons are accelerated by a voltage of a primary electron accelerating power source 17 into a primary electron beam 16. The primary electron beam 16 is caused to collide with the inner wall of the ion beam introduction tube 13 so as to generate electrons with lower energies (hereinafter called "secondary electron").

The secondary electrons are trapped in the ion beam 10 to be transported to the wafer 11. Thus the wafer 11 which lacks electrons is supplied with the secondary electrons thereby to prevent the wafer 11 from being charged positively. The filament 14 radiates the primary electrons to the entire circumference, a primary electron reflecting plate 15 is provided at the back of the filament 14 for reflecting the primary electrons, and a primary electron reflecting power source 18 supplies the primary electron reflecting plate 15 with a reverse bias voltage. This makes it possible to use almost all of the primary electrons generated as a primary electron beam 16.

But the prior art apparatus has the following disadvantage. The secondary electrons with an energy about equal to or less than 10 eV which are most effective to prevent the wafer from being charged are effectively generated. But the electrons with an energy more than 20~30 eV, which are a part of the secondary electrons and the primary electrons are also transported to the wafer 11. Consequently the wafer 11 is supplied with electrons in a number exceeding a required number, the wafer is charged negatively, and the insulator of the semiconductor wafer suffers electrostatic breakdown.

Furthermore the prior art apparatus has the following disadvantage. An ampere meter 20 measures the current of the ion beam 10. The ampere meter 20 is connected to the ion beam introduction tube 13 and the disk 12. Some of the primary and secondary electrons are driven out of the system of measurement of the ampere meter 20. These electrons cause errors in the ampere meter 20. These errors depend on the leakage of electrons out of the system.

The following is still another disadvantage of the prior art apparatus. Since the ion beam introduction tube 13 is subjected to the radiation of the ion beam 10 passing therethrough, ions stay on the inner wall of the tube 13 as impurities. In the prior art device of the structure as shown in FIG. 4, the ion introduction tube 13 becomes very hot due to the exothermic generated when the primary electron beam is radiated to the ion beam introduction tube 13. This frees or sputters the impurities staying on the tube 13, consequently polluting the wafer 11.

SUMMARY OF THE INVENTION

The object of the present invention is to provide an ion implant apparatus which keeps high energy electrons from the surface of a wafer thereby to prevent the wafer from being charged negatively, and which traps high energy electrons in the measuring system thereby to decrease errors in measuring a number of dopant atoms.

The object has been attained by the ion implant apparatus which forms ions from an ion source into an ion beam to implant the ions into a target to be ionimplanted through an ion beam introduction tube, said ion implant apparatus comprising: means for radiating an electron beam, said radiating means fixed on said ion beam introduction tube; and a target for being radiated by an electron beam, said electron beam target reflecting said electron beam in a reflectance beam, said electron beam causing a secondary electron beam to be emitted from said electron beam target, said electron beam target being formed so as to prevent said reflectance beam and said secondary electron beam from being directly radiated on said target to be ion-implanted.

BRIEF DESCRIPTION OF THE DRAWNGS

In the accompanying drawings:

FIG. 3 is a sectional view showing a wafer anti-static device of an ion implant apparatus according to a third embodiment of the present invention ;

FIG. 4 is a sectional view showing a wafer anti-static device of an ion implant apparatus according to a fourth embodiment of the present invention;

DETAILED DESCRIPTION OF THE INVENTION

Figure 1:
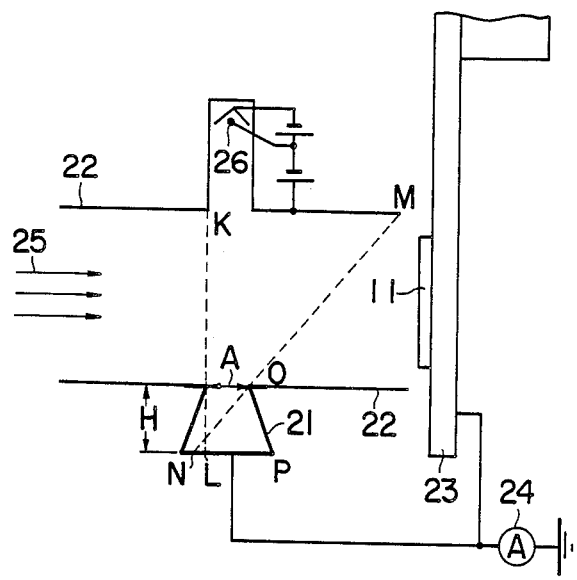
FIG. 1 is a sectional view showing a wafer anti-static device of an ion implant apparatus according to a first embodiment of the present invention.

FIG. 1 shows a wafer anti-static device of an ion implant apparatus according to a first embodiment of the present invention. A target 21 for being radiated by a primary electron beam is fixed on an opening of a wall of an ion beam introduction tube 22. The primary electron beam target 21 can be removed from the opening of the ion beam introduction tube 22. The primary electron beam target 21 and the opening of the ion beam introduction tube 22 are engaged with rails (not shown) for easy removal.

A form of the primary electron beam target 21 is determined in the following manner. A straight line from an end point M of the ion beam introduction tube 22 through a peripheral point O of the opening of the ion beam introduction tube 22 crosses the primary electron beam target 21 at a point N. A perpendicular from a peripheral point K of an opening of a recess in which a filament 26 is put crosses the primary electron beam target 21 at a point L. A depth H of the primary electron beam target 21 is determined so that the point N is on the left of the point L. In other words, an inner surface of the target 21 cannot be seen from any position on the wafer 11.

Thus the primary electron beam with a high energy through the point K collides with the primary electron beam target 21 at the point L to be reflected. This reflectance beam can collide with the target 21 at a surface OP again, but cannot collide with the tube 22 because of the form of the target 21. That is to say, the primary electron beam target 21 prevents the reflectance beam with a high energy from being radiated on a wafer 11. Only secondary electrons with a low energy are trapped in an ion beam 25 to be transported to a wafer 11. As a result, the wafer 11 is prevented from being charged positively, and also prevented from being supplied with electrons in a number exceeding a required number.

A metal may be used as a material of the primary electron beam target 21. The metal preferably has a high secondary electron emission efficiency unless the metal is deformed by heat.

In the apparatus shown in FIG. 1, an ampere meter 24 is connected to the target 21 and a disk 23 to measure the current of an ion beam 25 by counting ions introduced into the system of the measurement of the ampere meter 24. In order to decrease errors of measurement, it is necessary that high energy electrons not captured by the ion beam introduction tube 22 and the disk 23 are trapped in the system of the measurement. In the apparatus of the present embodiment, both the primary electron beam and the reflectance beam are captured by the target 21, and the secondary electron beam is captured by the ion beam 25 or the target 21. Therefore the ampere meter 24 of the embodiment produces fewer errors than the prior art. As described above, the present embodiment has another advantage that errors in measuring the current of the ion beam 25 are decreased.

The electron beam target 21 radiated by the primary electron beam is fixed in the outside of the tube 22 subjected to the radiation of the ion beam 25 passing therethrough. Thus the target 21 has few impurities on the surface thereof. As a result, few impurities are freed or sputtered, even if the target 21 is heated because of the radiation of the primary electron beam.

The target 21 can be removed from the tube 22 easily to be replaced by a new one. This results in that the wafer 11 can be prevented from being polluted, and that the target 21 can stably emit the secondary electrons.

Figure 2:
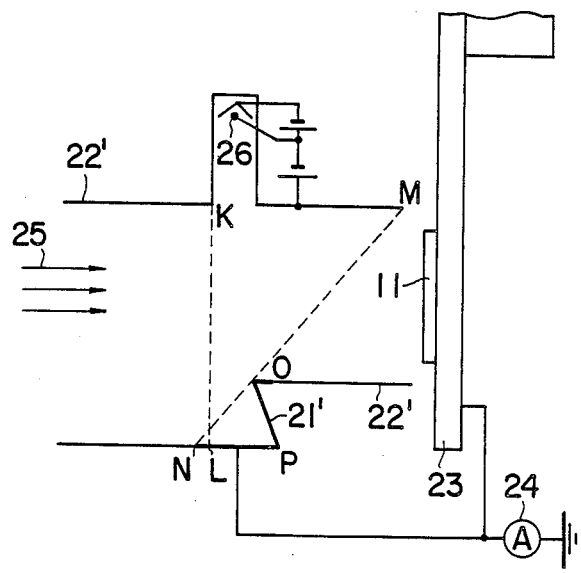
FIG. 2 is a sectional view showing a wafer anti-static device of an ion implant apparatus according to a second embodiment of the present invention.

FIG. 2 shows a wafer anti-static device of an ion implant apparatus according to a second embodiment of the present invention. The second embodiment differs from the first embodiment in shapes of both an electron beam target 21' and an ion beam introduction tube 22'. The electron beam target 21' has no wall to the left thereof. A wall of the ion beam introduction tube 22' continues to the bottom of the target 21'. A right wall OP of the target 21' can prevent the reflectance beam and the secondary electron beam from being directly radiated on the wafer 11. This results in that the wafer 11 is prevented from being charged.

FIG. 3 shows a wafer anti-static device of an ion implant apparatus according to a third embodiment of the present invention. A target 27 for being radiated by a primary electron beam is fixed on an opening of a wall of an ion beam introduction tube 22. The primary electron beam target 27 can be removed from the opening of the ion beam introduction tube 22. The primary electron beam target 27 and the opening of the ion beam introduction tube 22 are engaged with rails (not shown) for easy removal, like the first embodiment.

An apex angle $\theta$ of the target 27 is determined so that a reflectance beam at a wall thereof, even if the reflection angle is 180 degrees, is prevented from being directly radiated on the wafer 11. In other words, an inner surface of the target 27 cannot be seen from the wafer 11. Thus the electron beam with a high energy is prevented by the target 27 from being transported to the wafer 11. The wafer 11 is prevented from being supplied with electrons with a high energy in a number exceeding a required number. Only secondary electrons with a low energy are trapped in the ion beam 25 to be transported to the wafer 11. The present embodiment makes it possible to prevent the wafer from being charged positively in ion implantation process.

FIG. 4 shows a wafer anti-static device of an ion implant apparatus according to a fourth embodiment of the present invention. The fourth embodiment differs from the third embodiment in shapes of both an electron beam target 27' and an ion beam introduction tube 22. The electron beam target 27' with an apex angle $\theta$ is fixed on an inner wall of the ion beam introduction tube 22. A sectional area of the tube 22 is larger than the third embodiment so that the target 27' does not interrupt the ion beam 25. The target 27' is formed so that an outer surface thereof, which is to be radiated by the primary electron beam, cannot be seen from the wafer 11 like the third embodiment. The target 27' prevents the reflectance beam of the primary electron beam from being transported to the wafer 11.

The present invention may be practiced or embodied in still other ways without departing from the spirit or essential characteristics thereof. For example, the targets as shown in FIGS. 1~4 can be replaced by a target in other shape if the target is formed so as to prevent a reflection beam and a secondary electron beam from being directly radiated on the wafer, i.e., if the target is so formed that a surface of the target, which is to be radiated by the primary electron beam, cannot be seen from the wafer.

As mentioned above, the present invention makes it possible to keep high energy electrons from the surface of a wafer to prevent the wafer from being charged negatively, thereby to cause electrostatic breakdown to the insulator of the wafer.

A brief experiment shows that a yield of semiconductor devices manufactured by using the ion implant apparatus of the present invention increases to about 100 percent, though a yield of semiconductor devices manufactured by using the prior art ion implant apparatus is 80 percent.

Figure 5:
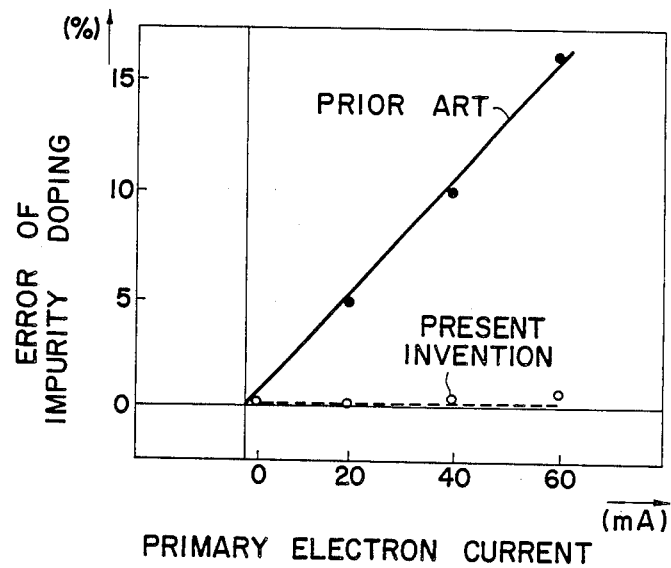
FIG. 5 is a graph showing measurement errors of impurities doped in the prior art and the present invention for comparison.
Figure 6:
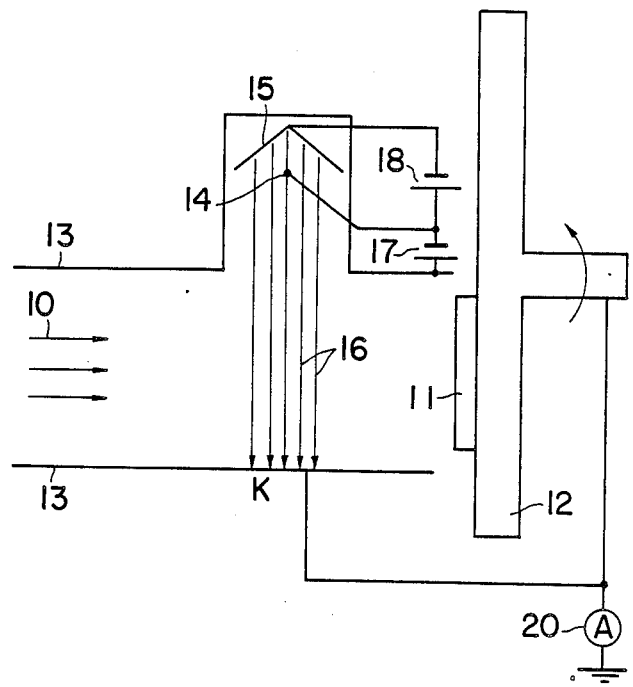
FIG. 6 is a sectional view showing a wafer anti-static device of a prior art ion implant apparatus.

FIG. 5 shows measurement errors of impurities doped of the prior art and the present invention. As shown in FIG. 5, measurement errors in the prior art are increasing substantially proportionally to an increase of a primary electron current, whereas measurement errors in the present invention keep about 0 percent even if a primary electron current increases.

Furthermore, the present invention makes it possible to prevent the wafer and the ion beam introduction tube from being polluted, because the target is not radiated by the ion beam.

What is claimed is:

1. An ion implant apparatus which forms ions from an ion source into an ion beam to implant the ions into a target to be ion-implanted through an ion beam introduction tube, said ion implant apparatus comprising:

means for radiating an electron beam, said radiating means fixed on said ion beam introduction tube; and a target radiated by said electron beam, said electron beam target reflecting said electron beam in a reflectance beam, said electron beam causing a secondary electron beam to be emitted from said electron beam target, said electron beam target being formed so as to prevent said reflectance beam and said secondary electron beam from being directly radiated on said target to be ion-implanted.

2. An apparatus according to claim 1, wherein said electron beam target comprises a recess formed in an inner wall of said ion beam introduction tube, said electron beam being radiated to an inner surface of said recess, said inner surface of said recess not being able to be seen from said target to be ion-implanted.

3. An apparatus according to claim 1, wherein said electron beam target comprises a protrusion formed on an inner wall of said ion beam introduction tube, said electron beam being radiated to an outer surface of said protrusion, said outer surface of said protrusion not being able to be seen from said target to be ion-implanted.

4. An apparatus according to claim 2, wherein said recess can be removed from said ion beam introduction tube.

5. An apparatus according to claim 3, wherein said protrusion can be removed from said ion beam introduction tube.

6. An apparatus according to claim 1, wherein said radiating means comprises a filament for emitting thermoelectrons, and means for accelerating said thermoelectrons.

7. An apparatus according to claim 2, wherein said radiating means comprises a filament for emitting thermoelectrons, and means for accelerating said thermoelectrons.

8. An apparatus according to claim 3, wherein said radiating means comprises a filament for emitting thermoelectrons, and means for accelerating said thermoelectrons.

9. An apparatus according to claim 4, wherein said radiating means comprises a filament for emitting thermoelectrons, and means for accelerating said thermoelectrons.

10. An apparatus according to claim 5, wherein said radiating means comprises a filament for emitting thermoelectrons, and means for accelerating said thermoelectrons.

11. An apparatus according to claim 1, additionally comprising measurement means for measuring the current of said ion beam.

12. An apparatus according to claim 11, additionally comprising a disk on which wafers to be implanted are held, wherein said measurement means is connected to said disk and said electron beam target.

* * * * *